(12) United States Patent
Ishii et al.

(10) Patent No.: US 10,403,652 B2
(45) Date of Patent: Sep. 3, 2019

(54) SEMICONDUCTOR CIRCUIT SUBSTRATE AND DISPLAY DEVICE USING THE SAME

(71) Applicant: Japan Display Inc., Tokyo (JP)

(72) Inventors: Yoshinori Ishii, Tokyo (JP); Kazufumi Watabe, Tokyo (JP); Hidekazu Miyake, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/661,086

(22) Filed: Jul. 27, 2017

(65) Prior Publication Data

US 2018/0040645 A1 Feb. 8, 2018

(30) Foreign Application Priority Data

Aug. 2, 2016 (JP) ................. 2016-152065

(51) Int. Cl.
| | |
|---|---|
| *H01L 27/12* | (2006.01) |
| *H01L 33/00* | (2010.01) |
| *H01L 29/786* | (2006.01) |
| *G02F 1/13* | (2006.01) |
| *G02F 1/1333* | (2006.01) |

(Continued)

(52) U.S. Cl.
CPC ........ *H01L 27/1248* (2013.01); *G02F 1/1303* (2013.01); *H01L 27/1262* (2013.01); *G02F 1/1362* (2013.01); *G02F 1/1368* (2013.01); *G02F 1/133345* (2013.01); *G02F 2001/133357* (2013.01); *G02F 2201/501* (2013.01);

(Continued)

(58) Field of Classification Search
CPC ... H01L 27/1214–1296; H01L 27/1248; H01L 27/1262; H01L 27/3258; H01L 27/32–3293; H01L 29/1604; H01L 29/78663; H01L 2227/323; H01L 51/0508–057; H01L 51/5206; H01L 2021/775; H01L 2924/1307; H01L 27/12–1255; H01L 2227/32–326; H01L 51/50–56; G02F 1/1368; G02F 1/133345; G02F 1/1334; G02F 1/133512; G02F 1/133514; G02F 1/133723; G02F 1/136; G02F 1/136213; G02F 1/136227; G02F 1/136286; G02F 1/13685; G02F 2001/133311; G02F 2001/133345; G02F 2001/133357; G02F 2001/133519; G02F 2001/133528; G02F 2001/133612; G02F 2001/13629

USPC ............ 257/52, 59, 72, 71, 88, 89, E33.001, 257/E27.01, E27.119, E27.121; 438/34

See application file for complete search history.

(56) References Cited

U.S. PATENT DOCUMENTS 9,437,618 B2 * 9/2016 Chou .................. H01L 27/1225
2002/0036462 A1 * 3/2002 Hirano .................. H01B 1/122
313/506

(Continued)

FOREIGN PATENT DOCUMENTS

JP 2004-349539 A 12/2004

*Primary Examiner* — Natalia A Gondarenko
(74) *Attorney, Agent, or Firm* — Michael Best & Friedrich LLP

(57) ABSTRACT

An organic EL display device has a semiconductor circuit substrate comprising a TFT and an organic passivation layer thereon. An AlO layer is formed over the organic passivation layer, and an electrode layer is formed on the AlO layer. The electrode layer connects with TFT via a through hole formed in the AlO layer and in the organic passivation layer.

17 Claims, 17 Drawing Sheets

(51) Int. Cl.
  *G02F 1/1368*  (2006.01)
  *H01L 27/32*  (2006.01)
  *H01L 51/52*  (2006.01)
  *G02F 1/1362*  (2006.01)

(52) U.S. Cl.
  CPC ...... *H01L 27/3258* (2013.01); *H01L 51/5206* (2013.01); *H01L 2227/323* (2013.01)

(56) References Cited

U.S. PATENT DOCUMENTS

| | | | | |
|---|---|---|---|---|
| 2007/0126969 | A1* | 6/2007 | Kimura | G02F 1/134363 349/141 |
| 2009/0278449 | A1* | 11/2009 | Choi | H01L 27/3244 313/504 |
| 2013/0069853 | A1* | 3/2013 | Choi | H01L 27/3276 345/80 |
| 2014/0054592 | A1* | 2/2014 | Gu | G02F 1/134363 257/71 |
| 2016/0018703 | A1* | 1/2016 | Wang | G02F 1/13439 257/72 |
| 2016/0093744 | A1* | 3/2016 | Sugawara | H01L 29/7869 257/43 |

* cited by examiner

SEMICONDUCTOR CIRCUIT SUBSTRATE AND DISPLAY DEVICE USING THE SAME

CLAIM OF PRIORITY

The present application claims priority from Japanese Patent Application JP 2016-152065 filed on Aug. 2, 2016, the content of which is hereby incorporated by reference into this application.

BACKGROUND OF THE INVENTION

(1) Field of the Invention

The present invention relates to a semiconductor circuit substrate and a display device using the same, particularly preventing a layer on an organic passivation layer from peeling off from the organic passivation layer due to gasses discharged from the organic passivation layer.

(2) Description of the Related Art

An organic EL display device and a liquid crystal display device use an organic passivation layer to flatten a pixel portion. In an organic EL display layer, an electrode or a reflection electrode is formed on the organic passivation layer. In a liquid crystal display device, a common electrode of ITO (Indium Tin Oxide) is formed on the organic passivation layer, and an insulating layer is formed on the common electrode.

An organic EL display device is comprised of many layers like a conductive layer, an insulating layer, an anode, an organic EL layer, a cathode, a protective layer, etc. A liquid crystal display is comprised of many layers like a conductive layer, an insulating layer, a common electrode, an interlayer insulating layer, a pixel electrode, etc. Thus, an adhesive strength between those layers becomes a problem in those display devices.

Japanese Unexamined Patent Application Publication No. 2004-349539 discloses, in a fabricating process of a display device having a resin substrate, wherein a resin substrate is formed on a glass substrate first, then, several layers for the display are formed on the resin substrate. After that, a light is applied at an interface between the glass substrate and the resin substrate, then, the glass substrate is taken off from the resin substrate.

SUMMARY OF THE INVENTION

An organic insulating layer (organic passivation layer herein after) generally contains moisture, etc. Poly-imide is a very important material specifically in a flexible display device because of its heat resistant property and mechanical strength. On the other hand poly-imide tends to contain moisture.

When a resin, e.g. an organic passivation film, contains moisture, it releases gasses in a baking process in a post process, consequently, a metal layer or insulating layer on the organic passivation film tends to come apart from the organic passivation film during the process. This causes a conduction failure or insulation failure in the display.

It is an object of the present invention to prevent a peeling off of a conductive electrode layer or an inorganic insulating layer from an organic passivation layer even if the organic passivation layer is made by a substance that tends to contain moisture like polyimide.

The purpose of the present invention is to realize the above object. The present invention is exemplified by the structures as described below.

(1) An organic EL display device having a semiconductor circuit substrate comprising a TFT and an organic passivation layer thereon,
an AlO layer formed over the organic passivation layer,
an electrode layer formed on the AlO layer,
the electrode layer connects with the TFT via a first through hole formed in the AlO layer and the organic passivation layer.

(2) An organic EL display device having a semiconductor circuit substrate comprising a TFT and an organic passivation layer thereon,
a first AlO layer formed over the organic passivation layer,
an electrode layer formed on the AlO layer,
a second AlO layer formed over the electrode layer,
the electrode layer connects with the TFT via a first through hole formed in the first AlO layer and the organic passivation layer.

(3) A liquid crystal display device having a semiconductor circuit substrate comprising a TFT and an organic passivation layer thereon,
an AlO layer formed over the organic passivation layer,
a first electrode formed on the AlO layer,
a first insulating layer is formed over the first electrode.

DETAILED DESCRIPTION OF THE PREFERRED EMBODIMENTS

The present invention will be described in detail referring to the following embodiments.

First Embodiment

Figure 1:
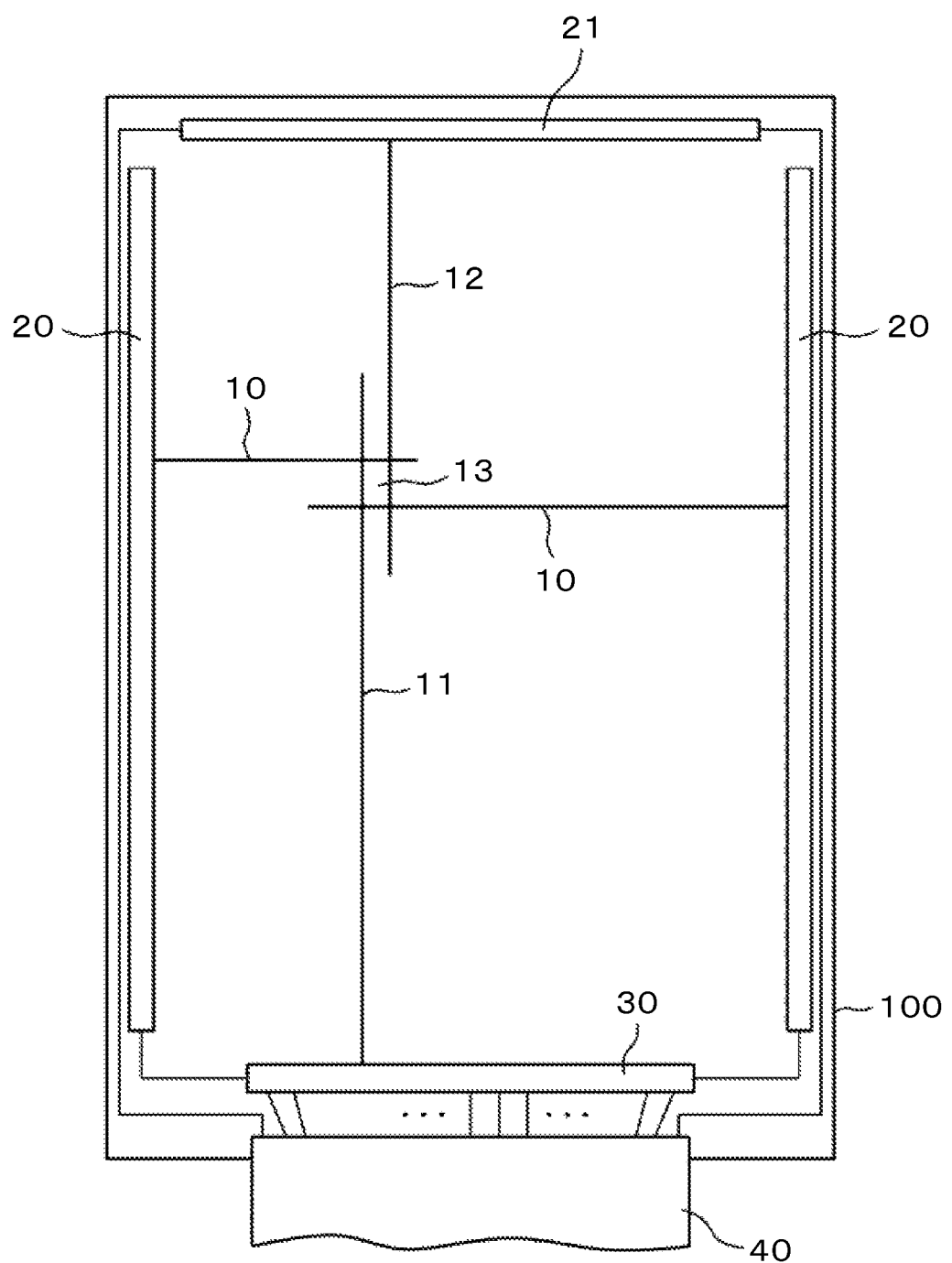
FIG. 1 is a plan view of an organic EL display device.

FIG. 1 is a plan view of the organic EL display device to which the present invention is applied. Referring to FIG. 1, a scanning signal line driver circuit 20, a current supply bus line 21, driver IC 30, which drives video signal line 11, are located in the periphery of the TFT substrate 100, and a display area is formed inside of them. The scanning signal driver circuits 20 are formed at the both sides of the display area; the scanning signal lines 10 extend from the both of the scanning signal line driver circuits 20 into the display area alternatively. The current supply lines 12 extend vertically in the display area from the current supply bus line 21 formed at the upper side of the TFT substrate; the video signal lines 11 extend vertically into the display area from the driver IC 30, which includes the video signal driver circuit. A pixel 13 is formed in the area surrounded by scanning signal lines 10, a video signal line 11 and a current supply line 12. A flexible wiring substrate 40 is connected to the TFT substrate 100 at the outside of the driver IC 30 to supply video signals, currents, and a clock signals, etc.

Figure 2:
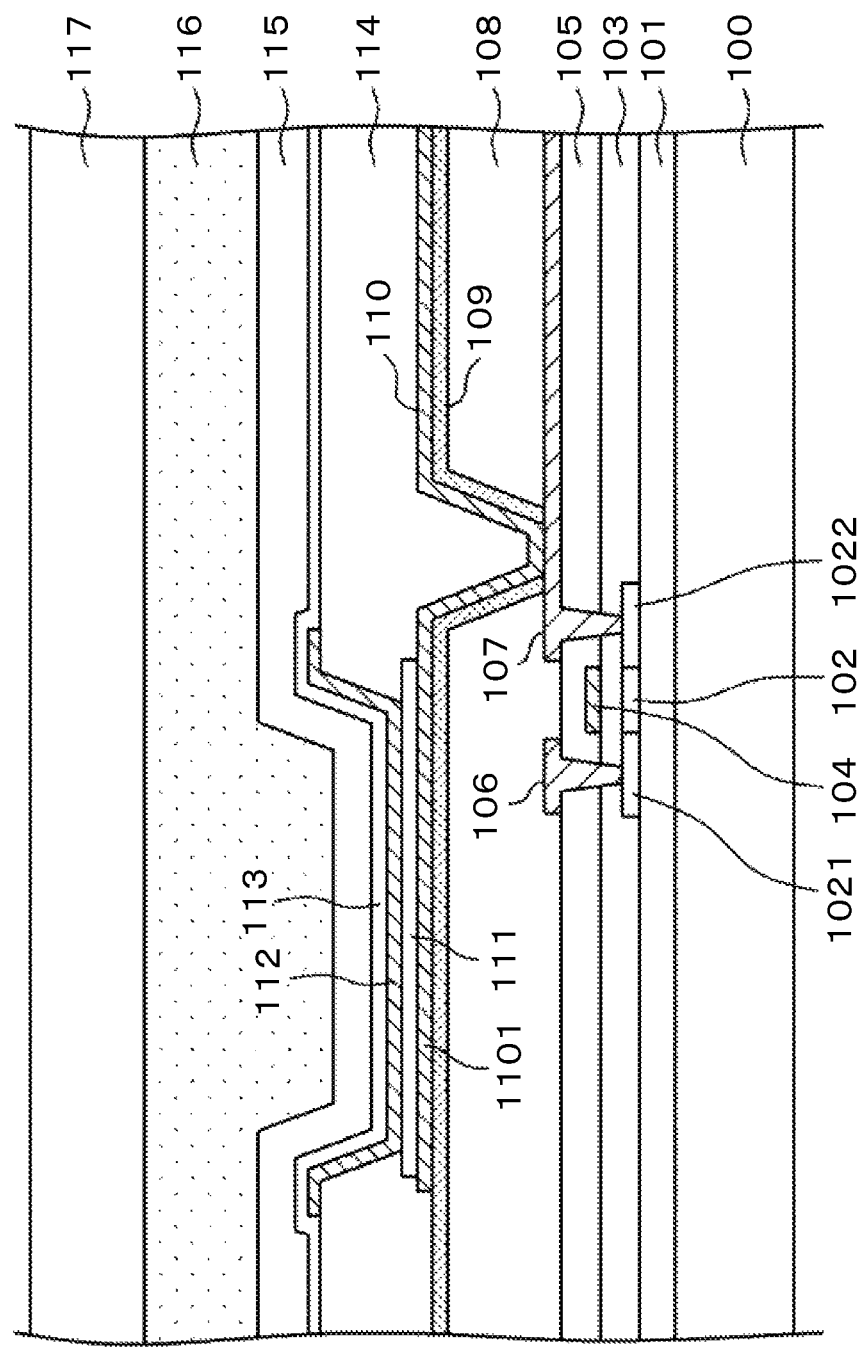
FIG. 2 is a cross sectional view of a pixel portion representing a first embodiment.

FIG. 2 is a cross sectional view of the display area of the organic EL display. Referring to FIG. 2, an undercoat 101 is formed on the TFT substrate 100 that is formed by glass. The undercoat 101, which is formed by a laminated film of a SiO layer, a SiN layer, etc., prevents a semiconductor layer from being contaminated by impurities of the glass. If a flexible display is required, the TFT substrate 100 is formed by a resin like poly imide. The resin substrate also needs an undercoat, however, in this case, a laminated layer may include a layer having more effective blocker against moisture like aluminum oxide (AlO), etc. in addition to the SiN layer and the SiO layer.

In this specification, substance AB (e.g. SiO) means a substance formed by an element A and an element B; it doesn't mean the ratio of A and B are equal ratio. In this specification, substance AB means it has basic elements of A and B, however, the ratio of A and B can be varied by a process condition, etc.

A semiconductor layer 102, which constitutes TFT (Thin Film Transistor), is formed on the undercoat 101. The semiconductor layer 102 is initially formed as a-Si (amorphous silicon) by CVD, after that, it is transferred to poly-Si (poly silicon) by applying excimer laser. A gate insulating layer is formed on the semiconductor layer; the gate insulating layer is formed by SiO by TEOS (Tetraethyl Orthosilicate) as a material. A gate electrode 104 is formed on the gate insulating layer 103. After that a drain 1021 and a source 1022 are formed by adding conductance in the semiconductor 102 that is not covered by the gate electrode 104 through an ion implantation of Phosphor or Boron, etc.

An interlayer insulating layer 105 of e.g. SiN is formed on the gate electrode 104. Through holes are formed in the interlayer insulating layer 105 and the gate insulating layer 103 for connections for the drain electrode 106 and source electrode 107. An organic passivation layer 108 is formed covering the drain electrode 106 and the source electrode 107. Poly imide is appropriate for the organic passivation layer 108. Poly imide has a good heat resistant property and mechanical strength. The poly imide for the organic passivation layer is formed by a photo sensitive resin. An irradiated portion of the photo sensitive material is dissolved in the developer, thus, a through hole can be formed without using a photo resist.

Poly imide tends to contain gasses, especially moisture. Thus, the poly imide is baked in a high temperature, e.g. 300° C., for one hour, to degas moisture and gasses from the poly imide as well as to cure the poly imide. However, a baking of 300° C., for one hour is not enough for thoroughly exhaust the poly imide of gasses and moisture. Thus, it is preferable to bake the poly imide at about 200° C., 10 hours to thoroughly release the moisture, etc. after thermosetting the poly imide. Baking time can be shortened than 10 hours according to a necessity of a process. Namely, an additional baking should be preferably conducted at 200° C. or more and for 1 hour or more.

Figure 3:
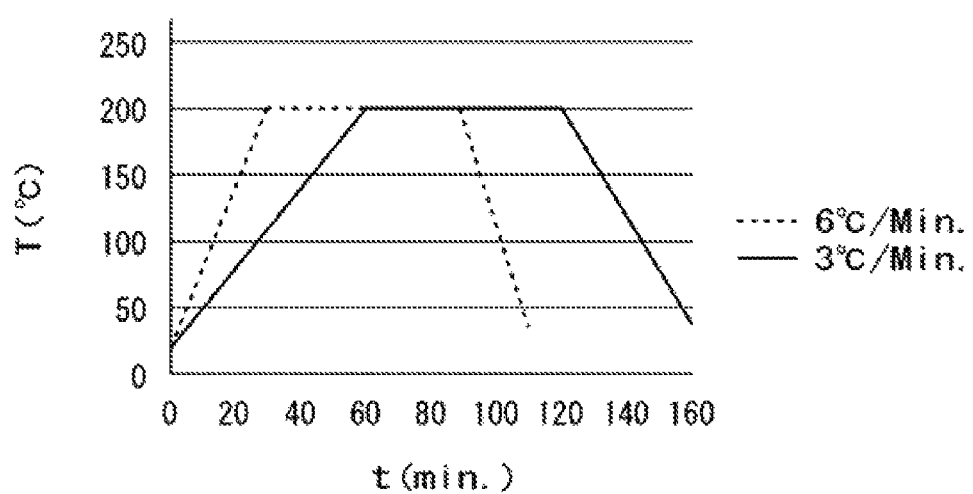
FIG. 3 is an example of a temperature profile of a baking of the organic passivation layer.

FIG. 3 is a temperature profile of baking of the poly imide. FIG. 3 shows a baking is one hour at 200° C. In this baking profile, a speed of temperature rise is important. In the present invention, a rate of temperature rise is 3° C./min. A rate of temperature rise of 6° C./min, as shown by a comparative example, has a danger that a layer formed on the organic passivation layer comes off from the organic passivation layer.

Back to FIG. 2, AlO layer 109, as a barrier layer, is formed on the organic passivation layer 108 by sputtering in 30 to 50 nm thickness. That is to say, the poly imide reabsorbs moisture, etc. again after the baking since the poly imide is easy to absorb moisture, etc. Forming the AlO layer 109, covering the organic passivation layer, prevents the poly imide from reabsorbing moisture, etc.

After that, an electrode layer 110 is formed on the organic passivation layer 108 formed by poly imide. The electrode layer 110 connects with the source electrode 107 via a through hole in the organic passivation layer 108. The electrode layer 110 is formed by an Al alloy; and it can work as a reflection electrode 1101 in a light emitting area located in the left hand side of FIG. 2. On the other hand, the electrode layer 110 in the right hand side of FIG. 2 connects with another element.

Referring to FIG. 2, anode 111 by ITO, etc., is formed on the reflection electrode 1101. After that, a bank 114 is formed by an organic substance. The bank 114 prevents the organic EL layer 112, formed in a later process, from a step disconnection; the bank further has a role to separate pixels from each other, etc. An organic EL layer 112 is formed in a through hole of the bank 114. The organic EL layer 112 is made of a plurality of layers like a hole injection layer, a hole transportation layer, a light emitting layer, an electron transportation layer, an electron injection layer, etc.

After that, a cathode 113 is formed by a transparent conductive layer as ITO, IZO (Indium Zinc Oxide), AZO (Antimony Zinc Oxide), etc. The cathode 113 is formed commonly all over the display area. A protective layer 115 of SiN, etc. is formed by CVD on the cathode 113. A polarizing plate 117 is adhered to the protective layer 115 with an adhesive 116. The polarizing plate 117 makes the display easy to be observed by preventing a reflection of an ambient light.

As to a manufacturing method of the organic EL display device, there exists a method that an array maker manufactures up to the electrode layer 110 or up to the anode 111, after that, a display device maker conducts post processes. In that case, the organic EL display has a chance to be laid in an atmosphere for a long time in a middle of the process after the electrode layer 110 or anode 111 are formed.

In that case, the organic passivation layer 108 is exposed to the atmosphere since the electrode layer 110, the reflection electrode 1101, anode 111, etc. shown in FIG. 2 don't cover all the surface of the organic passivation layer 108. Thus, the organic passivation layer 108 tends to absorb a lot of moisture in the atmosphere.

Meanwhile, the organic EL display maker bakes the organic EL display at a temperature higher than 200° C., e.g.

200° C. for one hour, to degas moisture or gasses. At that time, when the organic passivation layer discharges absorbed moisture or gasses, a layer on the organic passivation layer is peeled off.

Figure 4:
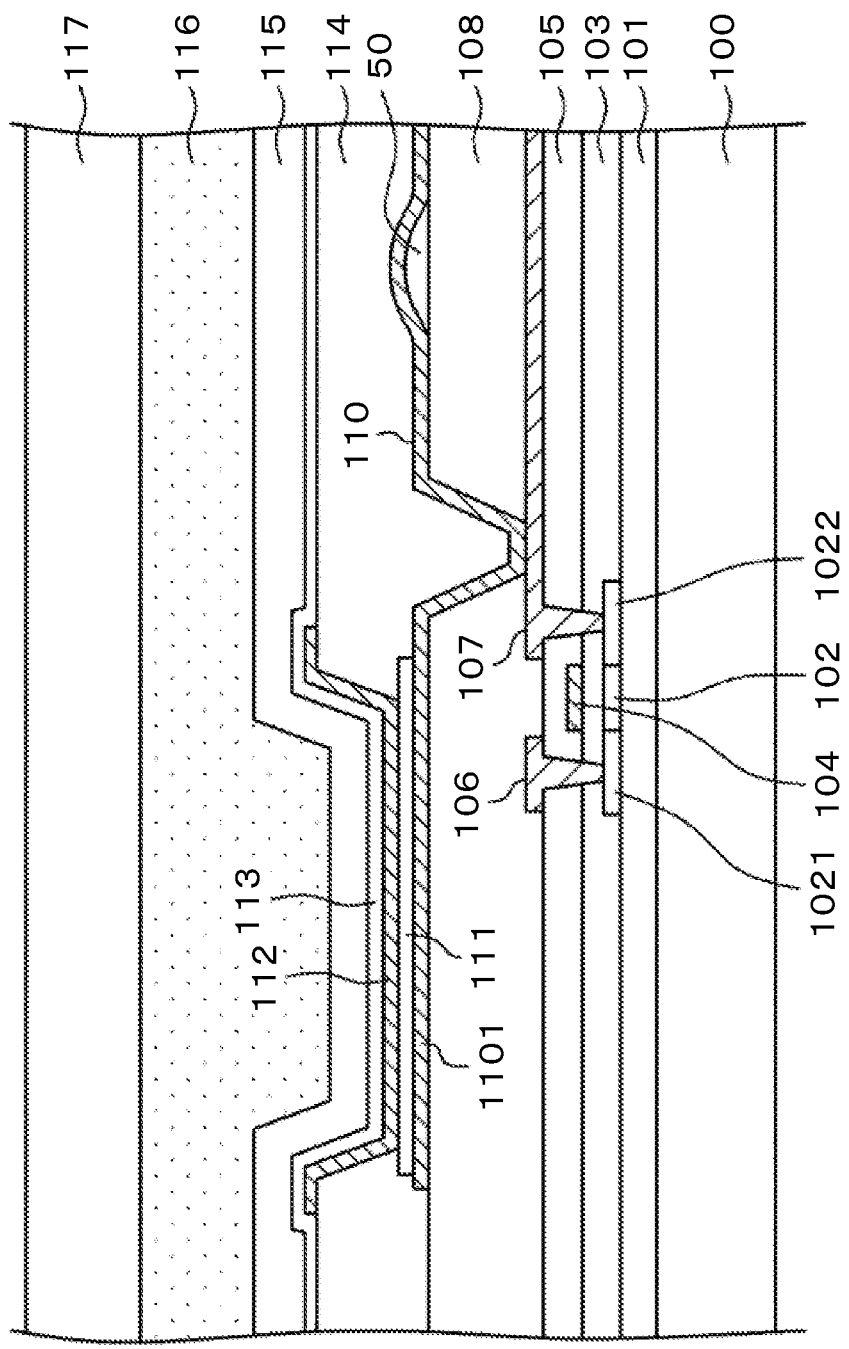
FIG. 4 is a sectional view showing a problem when the present invention is not used.

FIG. 4 is a cross section of an organic EL display device that doesn't use the present invention. Referring to FIG. 4, an AlO layer doesn't exist on the organic passivation layer; consequently, the electrode layer 110 or the reflection electrode 1101 is formed directly on the organic passivation layer 108. If the organic EL display device is left in the atmosphere after the organic passivation layer is formed, the organic passivation layer absorbs moisture. After that, when the organic EL display device maker bakes the organic EL display device before forming a bank, etc., the electrode layer 110 on the organic passivation layer 108 is peeled off, thus, a void 50 appears in the interface between the electrode layer 110 and the organic passivation layer.

On the contrary, in the present invention the organic passivation layer is baked for a long time, thus, the organic passivation layer is exhausted of moisture, etc., further, the organic passivation layer 108 is covered by the AlO layer 109, consequently, the organic passivation layer 108 is prevented from reabsorption of moisture, etc. from the atmosphere. Therefore, a peeling off of the electrode layer 110 and formation of the void 50 are prevented.

Figure 5:
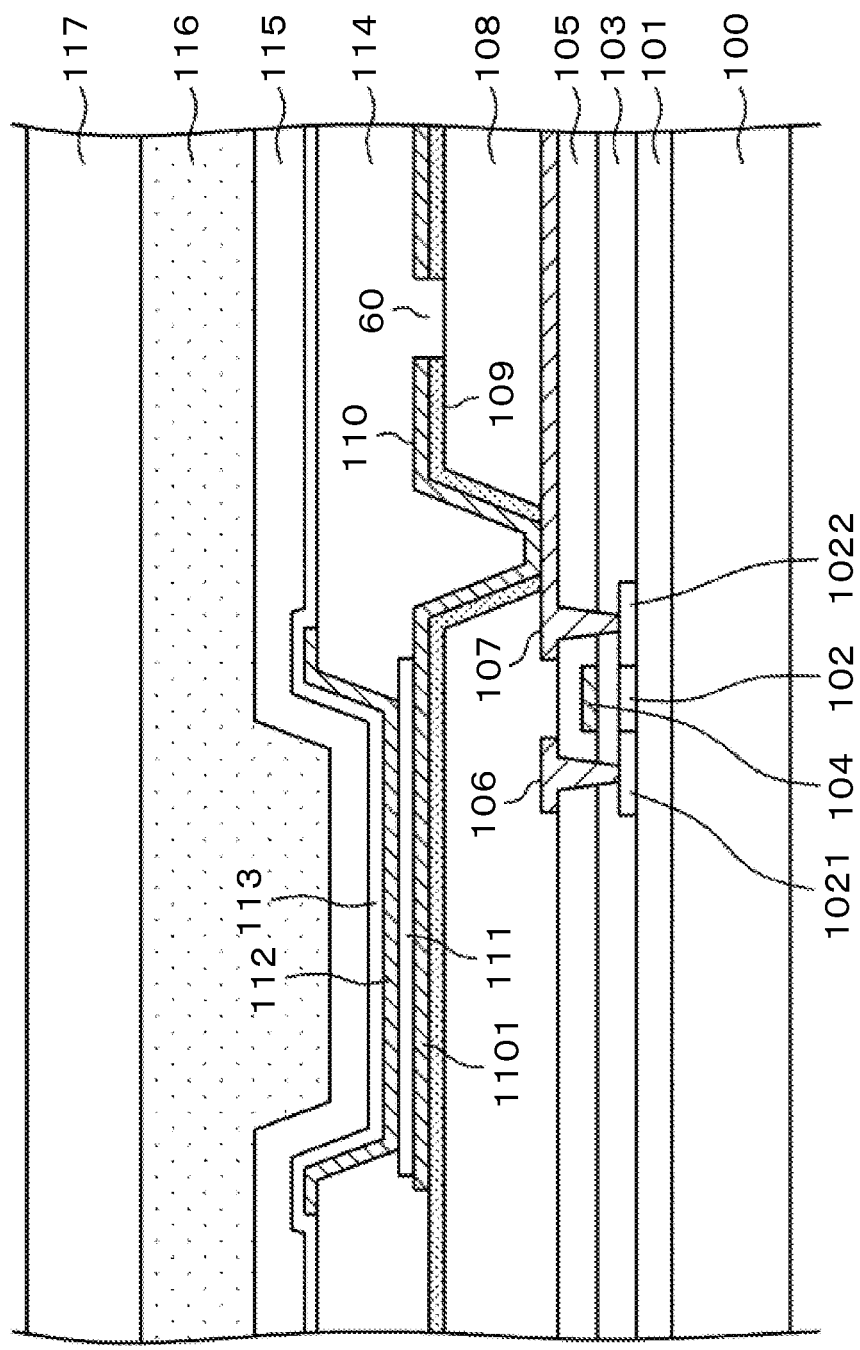
FIG. 5 is another example of the first embodiment.

FIG. 5 is a cross section of another example of the first embodiment. A difference of FIG. 5 from FIG. 2 is that there is a gas exhaust hole in the AlO layer 109 and in the electrode layer 110. When the organic passivation layer is not fully exhausted of gasses, there exists a danger that moisture or gasses, etc., are discharged from the organic passivation layer, consequently, the AlO layer 109 is peeled off from the organic passivation layer 108.

The structure of FIG. 5 has an exhaust hole in the AlO layer 109 and in the electrode layer 110 that releases gasses from the organic passivation layer 108 during the baking before forming the bank; thus, a peel of the AlO 109 from the organic passivation layer 108 can be prevented.

Figure 6:
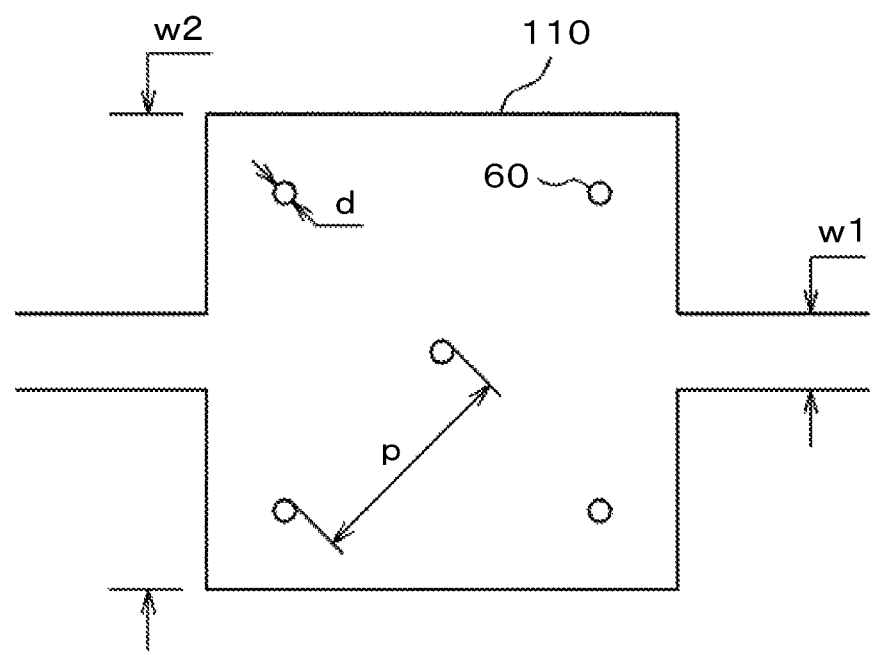
FIG. 6 is a plan view of gas exhaust holes.

Such a gas exhaust hole 60 is specifically effective when it is formed in the area where the AlO layer 109 and the electrode layer 110 are laminated. Further it is effective when the gas exhaust hole 60 is formed at a width of the electrode layer 110 is big. FIG. 6 is a plan view of an area where the gas exhaust holes 60 are formed. Referring to FIG. 6, a width w2 of the electrode layer 110 where the gas exhaust holes are formed is bigger than 20 μm. A diameter of gas exhaust hole 60 in the electrode layer 110 is about 10 μm, a pitch of the gas exhaust hole 60 is about 100 μm. On the other hand, the gas exhaust hole 60 is not necessarily needed where the width w1 of the electrode layer 110 is less than 20 μm.

Figure 7:
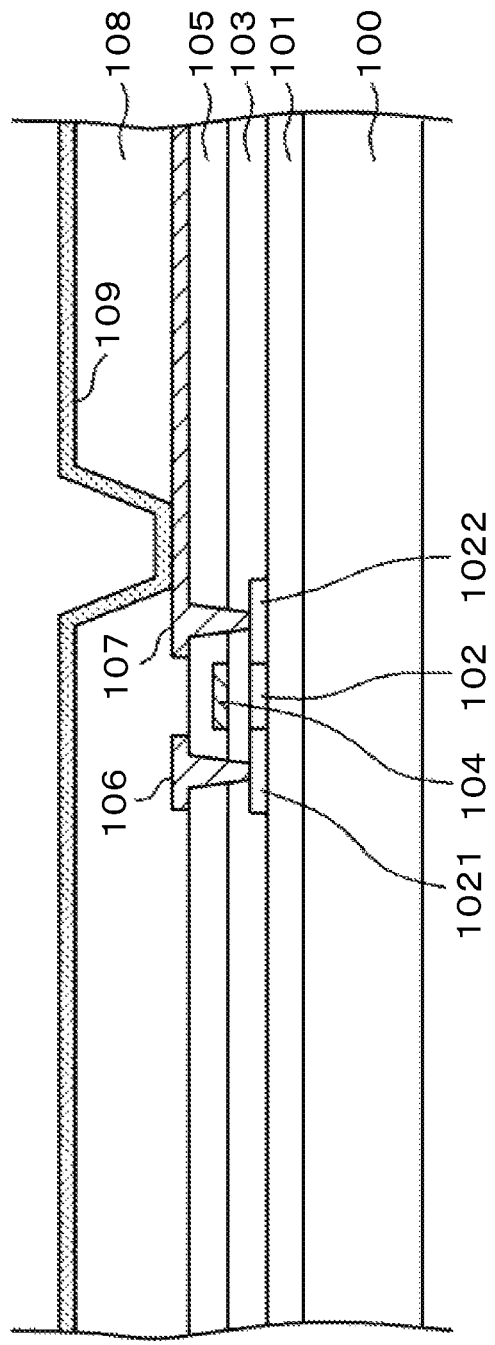
FIG. 7 is a cross sectional view of a structure that an AlO layer is formed on the organic passivation layer.

FIGS. 7-10 show a process to realize the structure of the present embodiment. FIG. 7 shows the AlO layer 109 is formed in a thickness about 30-50 nm on the organic passivation layer 108. The AlO layer 109 is formed by sputtering. Before forming the AlO layer 109, the organic passivation layer 108 is patterned, cured, and baked for degassing, preferably at approximately 200° C., for about 10 hours. In this baking, the rate of temperature rise is preferably less than 3° C./min.

Figure 8:
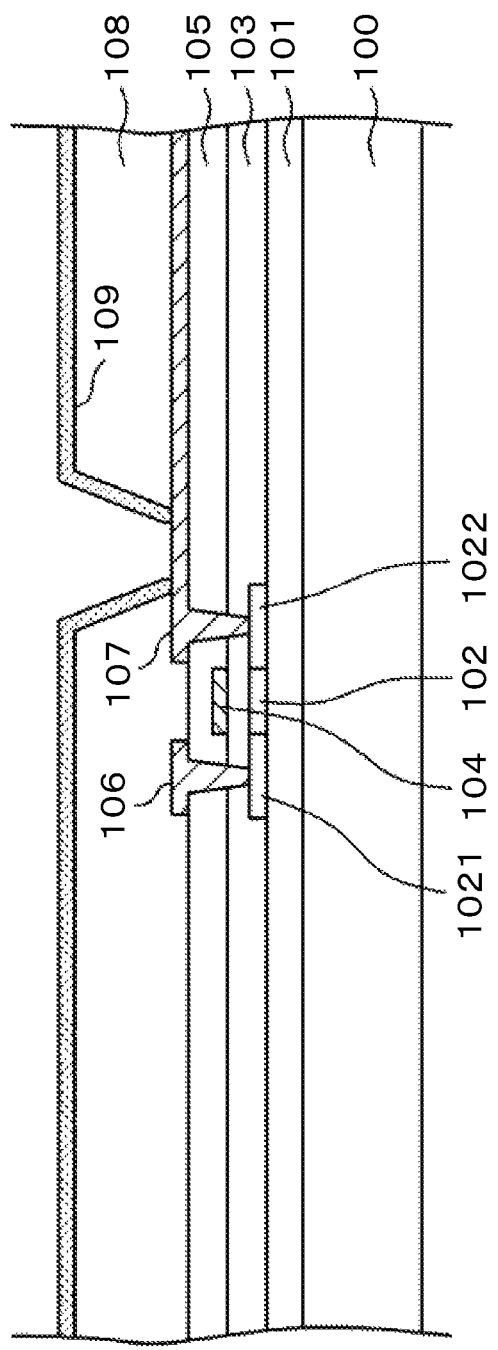
FIG. 8 is a cross sectional view showing a through hole formed in the AlO layer.
Figure 9:
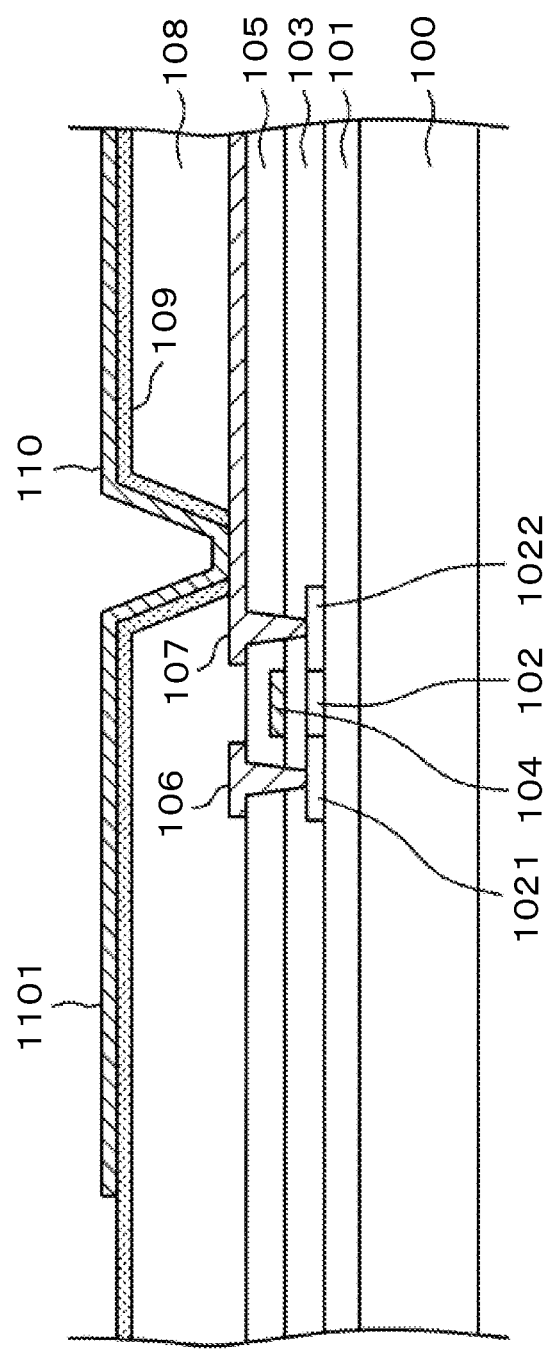
FIG. 9 is a cross sectional view showing an electrode layer is formed on the AlO layer.

FIG. 8 is a cross sectional view that shows a through hole is formed in the AlO layer 109 where a through hole of the organic passivation layer is formed. The through hole of the AlO layer 109 is formed by chlorine-based dry etching. After that, as shown in FIG. 9, the electrode layer 110 by e.g. aluminum alloy as A-Si, etc. is coated on the AlO layer, then, the electrode layer 110 is patterned by a photolythography.

Figure 10:
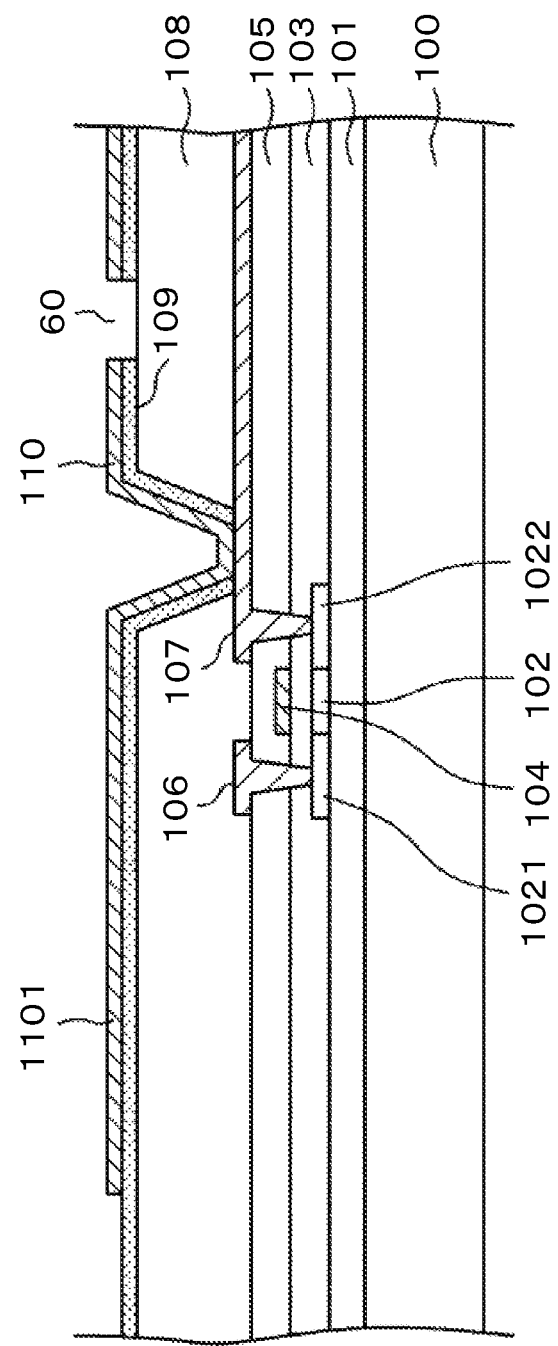
FIG. 10 is a cross sectional view showing a gas exhaust hole formed through the electrode layer and the AlO layer.

By the way, the Al alloy layer is generally sandwiched by a layer of high melting point metal like Ti, MoW alloy, etc. After that, as shown in FIG. 10, the gas exhaust hole 60 may be formed through the electrode layer 110 and the AlO layer 109.

Second Embodiment

Figure 11:
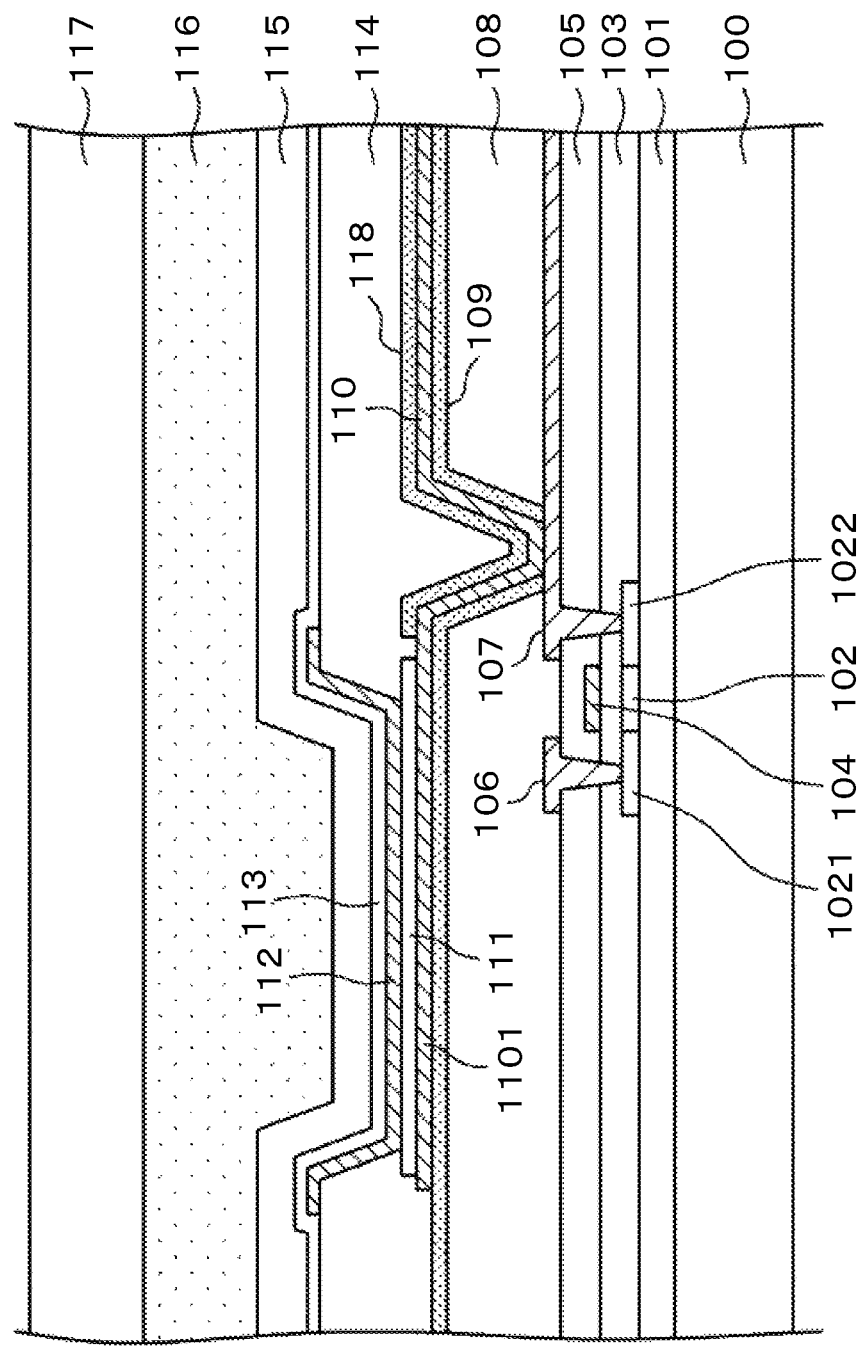
FIG. 11 is a cross sectional view of a pixel portion representing a second embodiment.

FIG. 11 is a cross sectional view of an organic EL display device according to a second embodiment. A difference of FIG. 11 from FIG. 2 is that a second AlO layer 118 is formed over the electrode layer 110. The electrode layer 110 becomes more difficult to be peeled off from the organic passivation layer 108 by sandwiching the electrode layer 110 with the second AlO layer 118 from an upper side and with the first AlO layer 109 from a lower side. In addition, the organic passivation layer 108 is double coated by AlO layers 109 and 118, thus, the organic passivation layer 108 is more effectively prevented from absorbing moisture in the atmosphere.

On the other hand, as shown in FIG. 11, the second AlO layer 118 is not formed in a light emitting area where the organic EL layer 112 is formed and the electrode layer 110 works as a reflection electrode 1101. The reason is that it is necessary to electrically connect the anode 111 and the reflection electrode 1101 in this area. Other structures of FIG. 11 are the same as the structures of FIG. 2.

Figure 12:
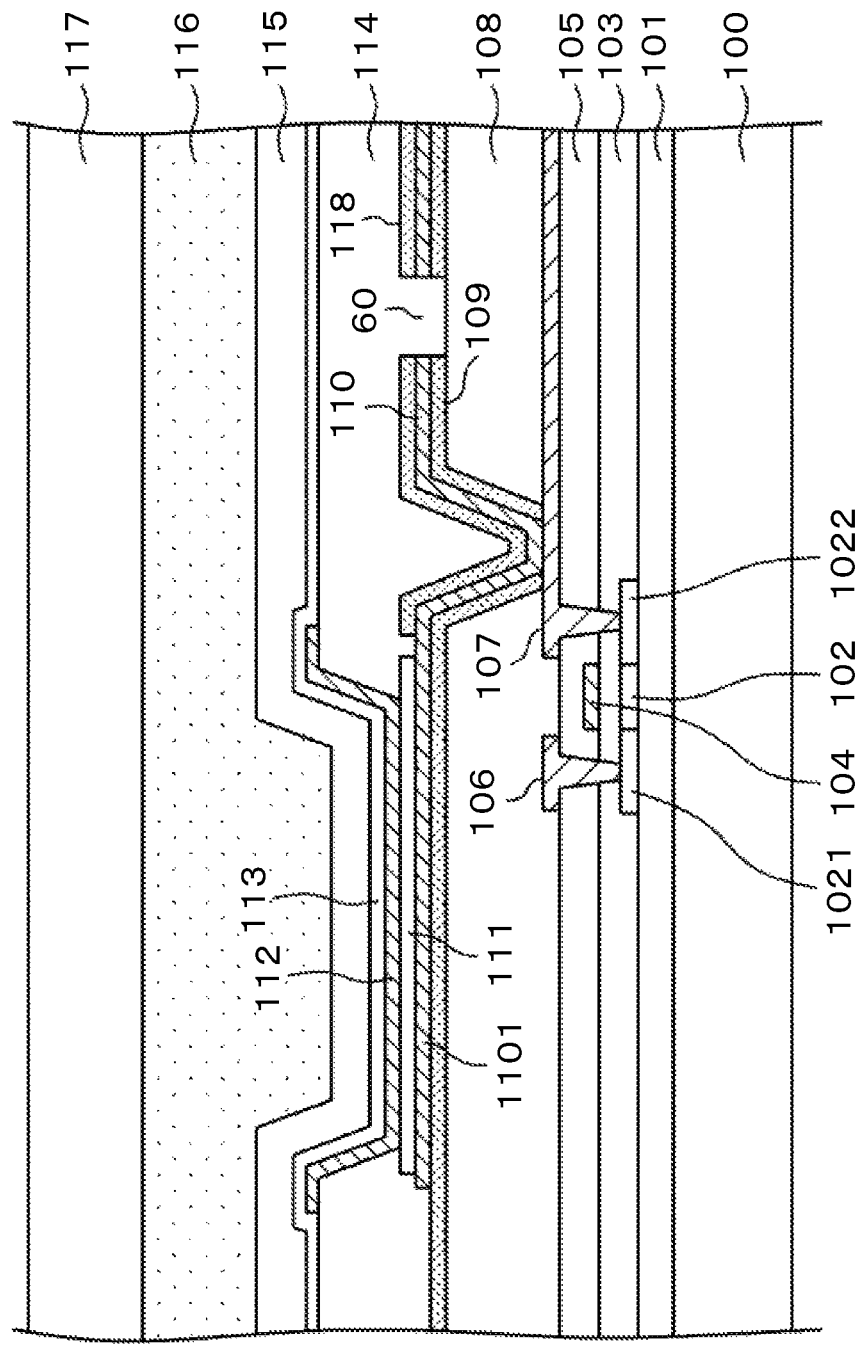
FIG. 12 is another example of the second embodiment.

FIG. 12 is a cross sectional view of another example of the second embodiment. A difference of FIG. 12 from FIG. 11 is that a gas exhaust hole 60 is formed in a lamination of the first AlO layer 109, the electrode layer 110 and the second AlO layer 118. The gas exhaust hole is a through hole through the first AlO layer 109, the electrode layer 110 and the second AlO layer 118.

The purpose of the gas exhaust hole 60 is the same as explained in the first embodiment. A plan view of the gas exhaust hole 10 and an arrangement of the gas exhaust holes is also the same as explained at FIG. 6. Thus, a danger of a peel off of the electrode layer 110 by discharged gasses form the organic passivation layer 108 is prevented by forming a gas exhaust hole 60.

Figure 13:
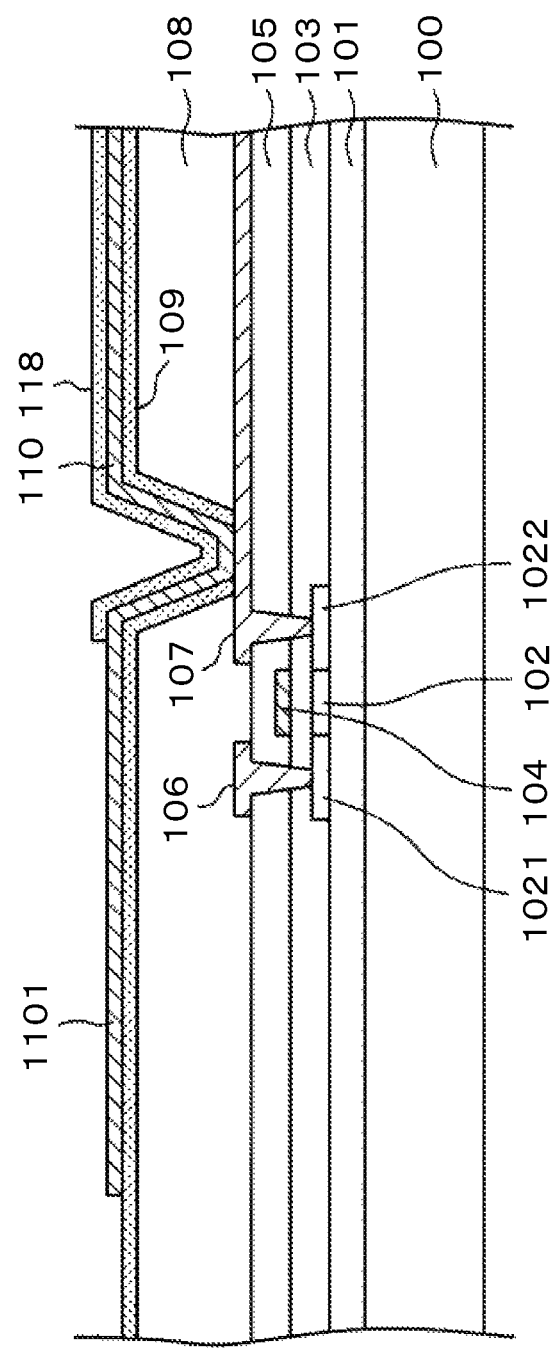
FIG. 13 is a cross sectional view that a second AlO layer is formed on the electrode layer.
Figure 14:
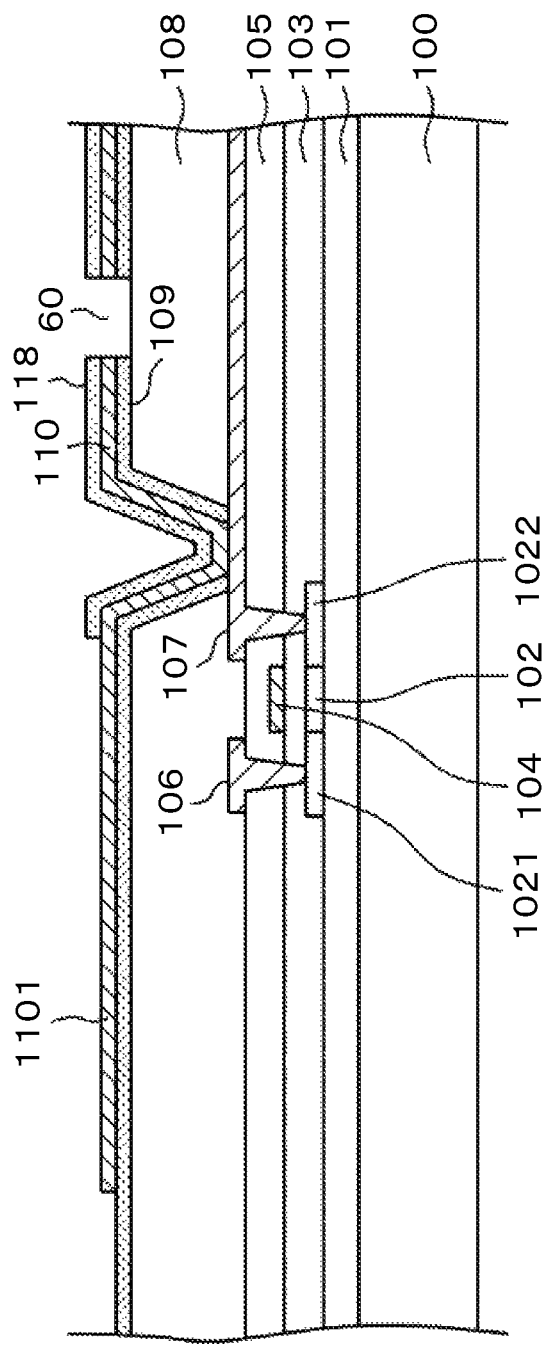
FIG. 14 is a cross sectional view showing a gas exhaust hole formed through the second AlO layer, the electrode layer and the first AlO layer.

FIGS. 13-14 are cross sectional view showing the process realizing the second embodiment. In FIG. 13, the processes up to forming the electrode layer 110 are the same as explained at FIGS. 7-9, however, in FIG. 13, the second AlO layer 118 of 30-50 nm thickness is formed by sputtering over the electrode layer 110. The second AlO layer 118 can be the same thickness as the first AlO layer 109 or can be different from the thickness of the first AlO layer 109.

FIG. 14 is a cross sectional view when a gas exhaust hole 60 is formed through the second AlO layer 118, the electrode layer 110, and the first AlO layer 103. An effect of the gas exhaust hole 60 is the same as the gas exhaust hole 60 of the first embodiment.

Third Embodiment

Figure 15:
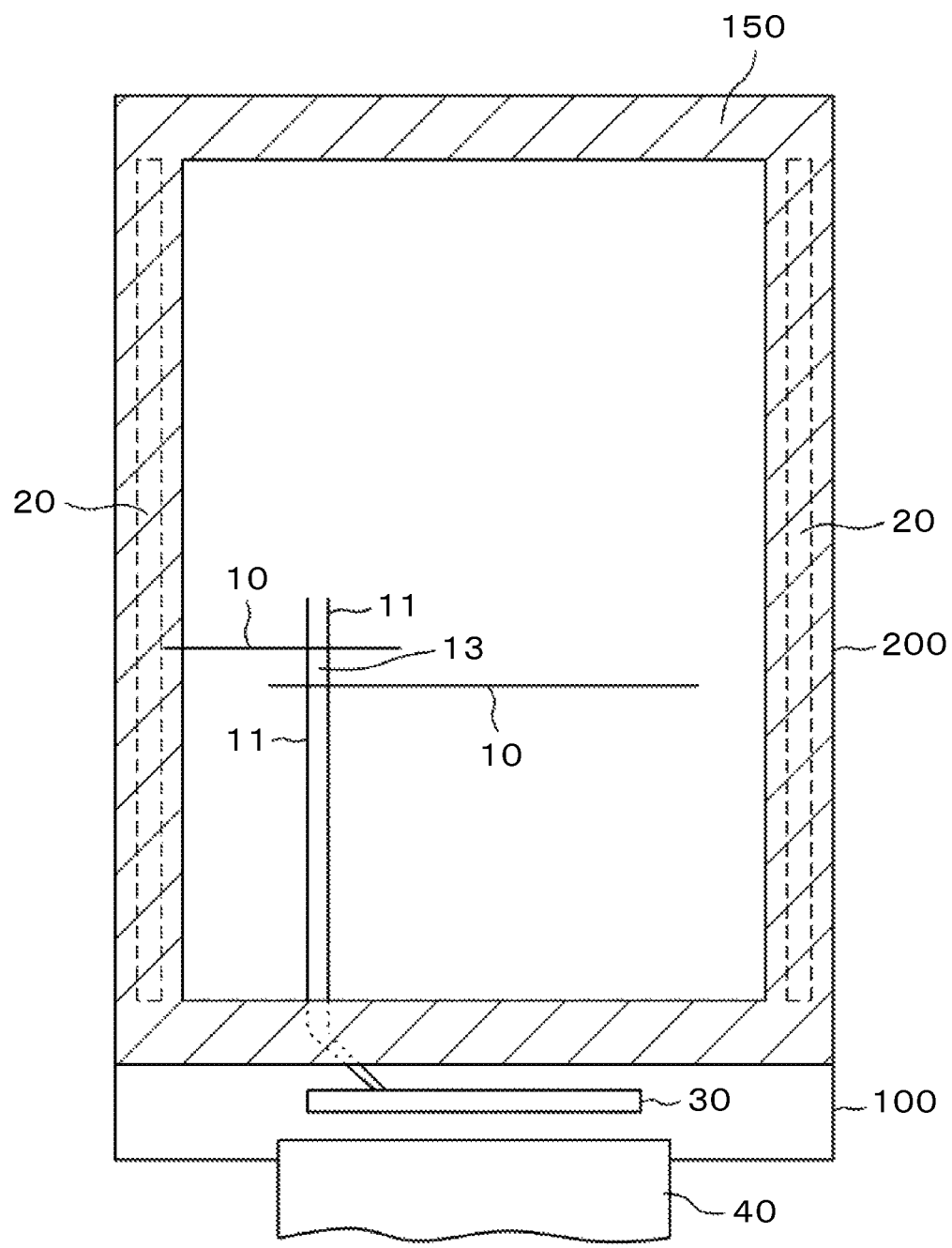
FIG. 15 is a plan view of a liquid crystal display device.

A third embodiment is an example that the present invention is applied to a liquid crystal display device. FIG. 15 is a plan view of the liquid crystal display device. Referring FIG. 15, a TFT substrate 100 and a counter substrate 200 are adhered at the periphery by a sealant 150; a liquid crystal layer is sealed by the sealant 150; and a display area is formed as being surrounded by the sealant 150.

A terminal region is formed at an area where the TFT substrate and the counter substrate don't overlap; driver IC 30 is set on the terminal area and a flexible wiring substrate 40 is connected to the terminal area. In FIG. 15, the scanning signal line driving circuits are formed at both sides of the display area; the scanning signal lines 10 extend from the both of the scanning signal line driver circuits 20 into the display area alternatively; the video signal lines 11 extend vertically into the display area from the driver IC 30. A pixel 13 is formed in the area surrounded by scanning signal lines 10 and video signal lines 11.

Figure 16:
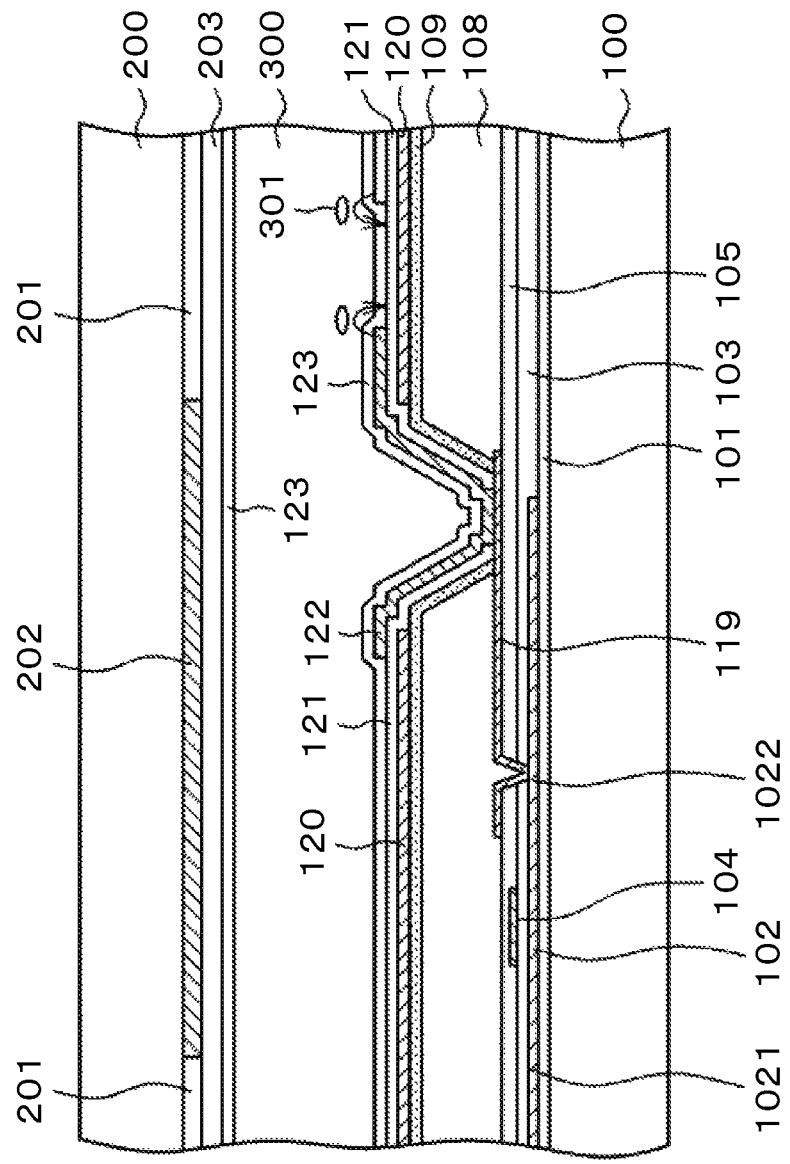
FIG. 16 is a cross sectional view of a pixel portion representing a third embodiment.

FIG. 16 is a cross sectional view of the pixel area of the liquid crystal display device according to the present invention. An undercoat 101 is formed on the TFT substrate 100. An effect of the undercoat 101 is the same as explained in the first embodiment regarding the organic EL display device. A semiconductor layer 102 is formed on the undercoat 101.

A gate insulating layer 103 is formed over the semiconductor layer 102; a gate electrode 104 is formed on the gate insulating layer 103. The scanning signal line 10 also works as a gate electrode 104. After the gate electrode 104 is formed, an ion implantation is applied to the semiconductor layer 102 to give a conductance to the semiconductor layer 102 other than the area the gate electrode covers, forming a drain 1021 and a source 1022.

Interlayer insulating layer 105 of SiN, etc. is formed by CVD over the gate electrode 104. A contact electrode 119 is formed on the interlayer insulating layer 105. The contact electrode 119 connects a pixel electrode 122 and source 1022 of the TFT via through hole formed in the interlayer insulating layer 105 and a gate insulating layer 193.

An organic passivation layer 108 of poly imide is formed over the interlayer insulating layer 105 and the contact electrode 119. The substance of the organic passivation layer is a photo sensitive material, thus, a though hole can be formed without using a photo resist. The organic passivation layer is baked to be cured at approximately 300° C., 1 hour.

An organic substance as poly imide tends to contain moisture, thus, after the curing, a baking of about 200° C. for 10 hours with temperature rise speed of about 3° C./min. is conducted as explained in the first embodiment. Further, as explained in the first embodiment, the AlO layer 109 of 30-50 nm is formed on the organic passivation layer to prevent the organic passivation layer from reabsorbing the moisture, etc. as explained in the first embodiment.

After that, in a through hole of the organic passivation layer 108, a through hole of the AlO layer 109 is formed to enable a contact between the contact electrode 119 and the pixel electrode 122. Then common electrode 120 of ITO is formed in a plane shape on the AlO layer 109. After that a capacitance insulating layer 121 is formed on the common electrode 120, and a comb shaped or stripe shaped pixel electrode 122 is formed by ITO on the capacitance electrode 121. The pixel electrode 122 contacts with the source 1022 of the TFT via the contact electrode 119 and a through hole of the capacitance insulating layer 121 formed in the through hole of the organic passivation layer 108.

After that an alignment layer 123 for an initial alignment of liquid crystal molecules is formed on the pixel electrode 122 and a capacitance insulating layer 121. In FIG. 16, when a voltage is applied to the pixel electrode 122, an electrical line of force as depicted by an arrow in FIG. 16 is generated; the line of force rotates the liquid crystal molecule 301, thus, controls a transmittance of the liquid crystal layer 300, and consequently forms a picture.

Referring to FIG. 16, a counter substrate 200 formed by glass is disposed to sandwich a liquid crystal layer 300 with the TFT substrate 100. A color filter 201 and a black matrix 202 are formed on an inner surface of the counter substrate 200; an overcoat layer 203 is formed on the color filter 201 and the black matrix 202. An alignment layer 123 is formed on the overcoat layer 203.

In this invention, the organic passivation layer 108, after curing, is additionally baked at 200° C. or more, for 1-10 hours; the organic passivation layer 108 can be effectively exhausted of gasses and moisture, etc. Further the AlO layer 109 is formed over the organic passivation layer 108; thus, reabsorption of moisture, etc. by the organic passivation layer 108 can be avoided.

Therefore, peeling off of the common electrode 120 or the capacitance insulating layer 121 from the organic passivation layer 108 due to gasses released from the organic passivation layer 108 can be avoided.

Figure 17:
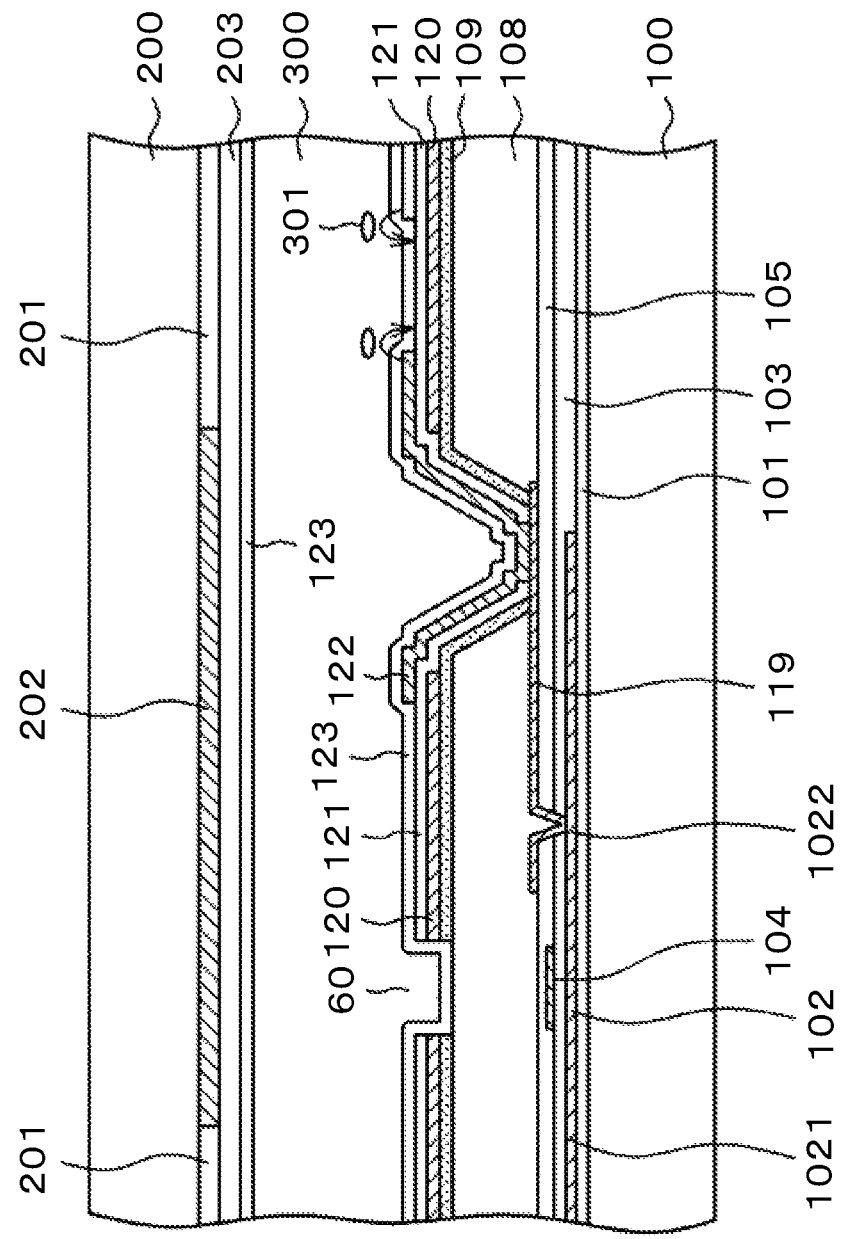
FIG. 17 is a cross sectional view of a pixel portion representing another example of the third embodiment.

FIG. 17 is a second example of the third embodiment. A difference of FIG. 17 from FIG. 16 is that a gas exhaust hole 60 is formed through the AlO layer 109, the common electrode 120 and the capacitance insulating layer 121, all formed over the organic passivation layer 108; thus, a peeling off of the common electrode 120 and the capacitance insulating layer 121 from the organic passivation layer 108 due to degas of remaining gas or moisture, etc. from the organic passivation layer 108 can be avoided.

A plan view and an arrangement of the gas exhaust hole 60 are the same as explained at FIG. 6. As explained above, a peeling of the common electrode 120 or the capacitance insulating layer 121 from the organic passivation layer 108 can be effectively avoided in the present invention.

FIGS. 16 and 17 show the common electrode 120, the capacitance insulating layer 121 and the pixel electrode 122 are laminated in this order on the AlO layer 109, which is formed on the organic passivation layer 108; however, the present invention is applicable to the reverse structure as that the pixel electrode 122, the capacitance insulating layer 121 and the common electrode 120 are laminated in this order.

The TFTs in the embodiments 1-3 are top gate type; however, the present invention is applicable to when TFTs are bottom gate type. An a-Si semiconductor is often used in a bottom gate type TFT. TFTs in the embodiments 1-3 use Si based semiconductor; however, this invention is applicable when oxide semiconductor as IGZO (Indium Gallium Zinc Oxide) is used in the TFTs.

What is claimed is:

1. A semiconductor circuit substrate comprising a thin film transistor (TFT) and an organic passivation layer thereon,
   an insulating layer made of aluminum oxide (AlO) formed on the organic passivation layer, and
   an electrode layer formed on the insulating layer, wherein
   the electrode layer connects with the TFT via a first through hole formed in the insulating layer and the organic passivation layer,
   a plurality of second through holes are formed through the electrode layer and the insulating layer on the organic passivation layer,
   the organic passivation layer is exposed at a bottom of the plurality of second through holes,
   the electrode layer has a linear portion and an enlarged portion,
   a width of the enlarged portion is wider than a width of the linear portion in a plan view, and
   the plurality of second through holes are formed in the enlarged portion.

2. The semiconductor circuit substrate according to claim 1,
   wherein the organic passivation layer is formed by poly-imide.

3. The semiconductor circuit substrate according to claim 1,
wherein the organic passivation layer is formed by a photo sensitive resin,
the organic passivation layer, after being patterned and cured, being baked at 200 centigrade or more for 1 hour or more, before forming the insulating layer.

4. The semiconductor circuit substrate according to claim 1,
wherein a thickness of the insulating layer is 30 nm to 50 nm.

5. A semiconductor circuit substrate comprising a thin film transistor (TFT) and an organic passivation layer thereon,
a first insulating layer made of aluminum oxide (AlO) formed on the organic passivation layer,
an electrode layer formed on the first insulating layer, and
a second insulating layer made of aluminum oxide (AlO) formed on the electrode layer, wherein
the electrode layer connects with the TFT via a first through hole formed in the first insulating layer and the organic passivation layer,
a plurality of second through holes are formed through the second insulating layer, the electrode layer and the first insulating layer on the organic passivation layer,
the organic passivation layer is at a bottom of the plurality of second through holes,
the electrode layer has a linear portion and an enlarged portion,
a width of the enlarged portion is wider than a width of the linear portion in a plan view, and
the plurality of second through holes are formed in the enlarged portion.

6. The semiconductor circuit substrate according to claim 5,
wherein the organic passivation layer is formed by polyimide.

7. The semiconductor circuit substrate according to claim 5,
wherein the organic passivation layer is formed by a photo sensitive resin,
the organic passivation layer, after being patterned and cured, being baked at 200 centigrade or more for 1 hour or more, before forming the first insulating layer.

8. The semiconductor circuit substrate according to claim 5,
wherein a thickness of the first insulating layer is 30 nm to 50 nm.

9. The semiconductor circuit substrate according to claim 5,
wherein a thickness of the second insulating layer is 30 nm to 50 nm.

10. A semiconductor circuit substrate comprising a thin film transistor (TFT) and an organic passivation layer thereon,
a first insulating layer formed on the organic passivation layer,
a first electrode formed on the first insulating layer, and
a second insulating layer is formed on the first electrode,
wherein a plurality of through holes are formed through the first insulating layer, the first electrode and the second insulating layer on the organic passivation layer,
the organic passivation layer is exposed at a bottom of the plurality of through holes,
the electrode layer has a linear portion and an enlarged portion,
a width of the enlarged portion is wider than a width of the linear portion in a plan view,
the plurality of through holes are formed in the enlarged portion, and
at least the first insulating layer is made of aluminum oxide (AlO).

11. The semiconductor circuit substrate according to claim 10,
wherein the organic passivation layer is formed by polyimide.

12. The semiconductor circuit substrate according to claim 10,
wherein the organic passivation layer is formed by a photo sensitive resin,
the organic passivation layer, after being patterned and cured, being baked at 200 centigrade or more for 1 hour or more, before forming the first insulating layer.

13. The semiconductor circuit substrate according to claim 10,
wherein a thickness of the first insulating layer is 30 nm to 50 nm.

14. The semiconductor circuit substrate according to claim 10,
wherein a second electrode is formed on the second insulating layer,
the second electrode layer connects with the thin film transistor (TFT) via a second through hole formed in the first insulating layer and the organic passivation layer, and
the first electrode is a common electrode, and the second electrode is a pixel electrode.

15. The semiconductor circuit substrate according to claim 10,
wherein a second electrode is formed on the second insulating layer,
the first electrode layer connects with the thin film transistor (TFT) via a second through hole formed in the first insulating layer and the organic passivation layer, and
the first electrode is a pixel electrode and the second electrode is a common electrode.

16. An organic EL display device comprising the semiconductor circuit substrate according to claim 1.

17. A liquid crystal display device comprising the semiconductor circuit substrate according to claim 1.

* * * * *